United States Patent
Tobisaka et al.

(10) Patent No.: US 8,314,006 B2
(45) Date of Patent: Nov. 20, 2012

(54) METHOD FOR MANUFACTURING BONDED WAFER

(75) Inventors: Yuji Tobisaka, Gunma (JP); Yoshihiro Kubota, Gunma (JP); Atsuo Ito, Tokyo (JP); Kouichi Tanaka, Gunma (JP); Makoto Kawai, Gunma (JP); Shoji Akiyama, Gunma (JP); Hiroshi Tamura, Gunma (JP)

(73) Assignee: Shin-Etsu Chemical Co., Ltd. (JP)

( * ) Notice: Subject to any disclaimer, the term of this patent is extended or adjusted under 35 U.S.C. 154(b) by 0 days.

(21) Appl. No.: 12/934,788

(22) PCT Filed: Apr. 10, 2009

(86) PCT No.: PCT/JP2009/057372
§ 371 (c)(1),
(2), (4) Date: Jan. 20, 2011

(87) PCT Pub. No.: WO2009/125844
PCT Pub. Date: Oct. 15, 2009

(65) Prior Publication Data
US 2011/0104871 A1 May 5, 2011

(30) Foreign Application Priority Data
Apr. 10, 2008 (JP) .................. 2008-102148

(51) Int. Cl.
*H01L 21/30* (2006.01)
*H01L 21/46* (2006.01)
(52) U.S. Cl. . 438/455; 438/458; 438/459; 257/E21.568; 257/E21.57
(58) Field of Classification Search .................. 438/455, 438/458, 459; 257/E21.568, E21.57
See application file for complete search history.

(56) References Cited

U.S. PATENT DOCUMENTS
6,263,941 B1  7/2001  Bryan et al.
(Continued)

FOREIGN PATENT DOCUMENTS
EP   1381086 A1   1/2004
(Continued)

OTHER PUBLICATIONS
Supplementary European Search Report, EP 09730414, dated May 30, 2011.
(Continued)

*Primary Examiner* — Hsien Ming Lee
(74) *Attorney, Agent, or Firm* — Lerner, David, Littenberg, Krumholz & Mentlik, LLP

(57) ABSTRACT

Provided is a method for manufacturing a bonded wafer with a good thin film over the entire substrate surface, especially in the vicinity of the lamination terminal point. The method for manufacturing a bonded wafer comprises at least the following steps of: forming an ion-implanted region by implanting a hydrogen ion or a rare gas ion, or the both types of ions from a surface of a first substrate which is a semiconductor substrate; subjecting at least one of an ion-implanted surface of the first substrate and a surface of a second substrate to be attached to a surface activation treatment; laminating the ion-implanted surface of the first substrate and the surface of the second substrate in an atmosphere with a humidity of 30% or less and/or a moisture content of 6 g/m$^3$ or less; and a splitting the first substrate at the ion-implanted region so as to reduce thickness of the first substrate, thereby manufacturing a bonded wafer with a thin film on the second substrate.

6 Claims, 3 Drawing Sheets

PREPARATION OF SUBSTRATE

ION IMPLANTATION

U.S. PATENT DOCUMENTS

| | | |
|---|---|---|
| 6,513,564 B2 | 2/2003 | Bryan et al. |
| 6,582,999 B2 | 6/2003 | Henley et al. |
| 2004/0035525 A1* | 2/2004 | Yokokawa et al. ............ 156/281 |
| 2004/0171231 A1 | 9/2004 | Yanagita et al. |
| 2005/0266653 A1 | 12/2005 | Moriwaki |
| 2006/0073644 A1* | 4/2006 | Atoji et al. .................... 438/147 |
| 2006/0281280 A1* | 12/2006 | Endo et al. .................... 438/455 |
| 2007/0281445 A1 | 12/2007 | Nguyen et al. |

FOREIGN PATENT DOCUMENTS

| | | |
|---|---|---|
| JP | 05-190406 | 7/1993 |
| JP | 5-211128 A | 8/1993 |
| JP | 11-145438 A | 5/1999 |
| JP | 2004-266071 | 9/2004 |
| JP | 2005-347302 A | 12/2005 |
| JP | 2006-210898 | 8/2006 |
| JP | 2007-141946 A | 6/2007 |
| WO | 2005-024917 | 2/2005 |
| WO | 2007072632 A1 | 6/2007 |

OTHER PUBLICATIONS

A.J. Auberton-Herve et al., "Smart Cut Technology: Industrial Status of SOI Wafer Production and New Material Developments" (Electrochemical Society Proceedings vol. 99-3 (1999) p. 93-106.

International Search Report, PCT/JP2009/057372, dated Jun. 9, 2009.

Jin et al, "Study on the Micro-Kinetics of Silicon Wafer Direct Bonding", Semiconductor Technology, 24(6); 33-35 (1992). (English translation of abstract only).

Office Action from Chinese Application No. 200980112677.1 dated Nov. 18, 2011.

* cited by examiner

SPREADING OF CLOSELY ATTACHED AREA

SPREADING OF CLOSELY ATTACHED AREA

SPREADING OF CLOSELY ATTACHED AREA AT OUTER CIRCUMFERENCE OF WAFER

FIG.4(a) PREPARATION OF SUBSTRATE
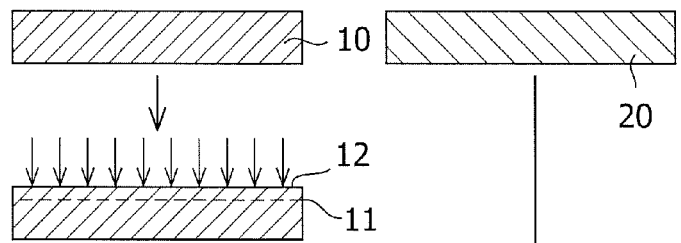
FIG.4(b) ION IMPLANTATION
FIG.4(c) SURFACE ACTIVATION TREATMENT
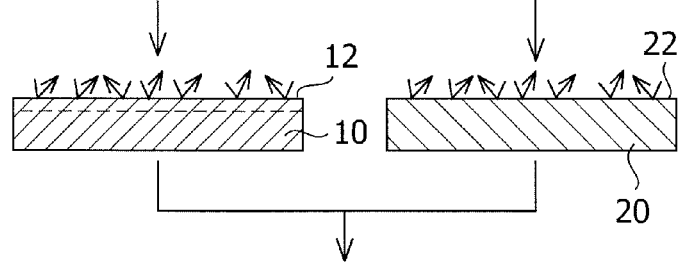
FIG.4(d) LAMINATION
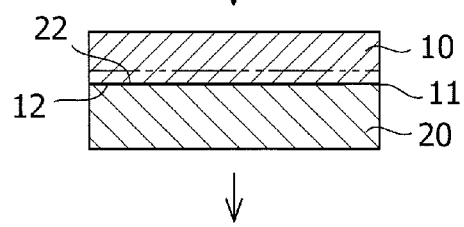
FIG.4(e) SPLIT AT ION-IMPLANTED REGION
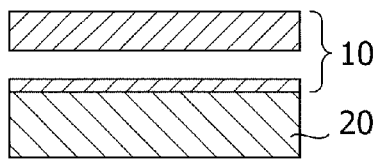
FIG.4(f) BONDED WAFER
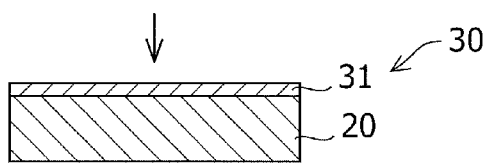

METHOD FOR MANUFACTURING BONDED WAFER

CROSS REFERENCE TO RELATED APPLICATIONS

The present application is a national phase entry under 35 U.S.C. § 371 of International Application No. PCT/JP2009/057372, filed Apr. 10, 2009, published in Japanese, which claims the benefit of Japanese Patent Application No. 2008-102148, filed Apr. 10, 2008. The entire disclosures of each of the above-identified applications are incorporated by reference herein.

TECHNICAL FIELD

The present invention relates to a method for manufacturing a bonded wafer.

BACKGROUND ART

Silicon-On-Insulator (SOI) substrates have been drawing attention in recent years, in order to achieve higher performance for semiconductor devices. Silicon-On-Quartz (SOQ) substrates and Silicon-On-Sapphire (SOS) substrates, etc., which have a support substrate (handle wafer) devoid of silicon, each has been used in fields such as TFT-LCDs and high-frequency (RF) devices.

While there are some methods for manufacturing the bonded wafer, the SmartCut™ method can be typically used. In this method, hydrogen ions are implanted into a single-crystal silicon substrate with an oxide film formed (a donor wafer, also referred to as a first substrate in the specification), the single-crystal silicon substrate is attached to a support substrate (a handle wafer, also referred to as a second substrate in the specification), and then heated to around 500° C., and splits the silicon substrate along the hydrogen ion-implanted region so as to transfer the single-crystal silicon thin film to the handle wafer. In this case, the formation of minute hydrogen cavities referred to as microcavities at the hydrogen implanted region allows the split at the interface. After that, in the SmartCut™ method, in order to increase the bonding strength between the single-crystal silicon thin film and the handle wafer, a heat treatment at a high temperature of 1000° C. or more is carried out, followed by a final surface treatment (CMP, a heat treatment, etc.) (See e.g. Patent Documents 1 and 2 and Non-Patent Document 1).

On the other hand, in the SiGen method, prior to attaching a silicon substrate with a surface to be attached and with the surface subjected to implantation of hydrogen ions or the like to a silicon substrate or a substrate of the other material, one or both of the surfaces of these substrates to be attached are subjected to a plasma treatment, the both substrates are attached to each other with the surface(s) activated, and subjected to a heat treatment at a low temperature such as, for example, 350° C. to increase bonding strength, and mechanical split is then carried out at ordinary temperature to obtain an bonded SOI wafer (see e.g. Patent Documents 3 to 5).

The difference between these two methods mainly consists in the process for splitting a silicon thin film, and is that the SmartCut™ method requires a treatment at a high temperature for splitting of a silicon thin film, whereas the SiGen method is capable of splitting at ordinary temperature.

In particular, when a semiconductor substrate such as a silicon substrate is attached to another substrate to manufacture a bonded wafer, the obtained wafer tends to have breaks or cracks due to the differences in the thermal expansion coefficient and the allowable temperature limit between the different materials. Thus, it is desirable to carry out the steps up to the split treatment at a temperature as low as possible. Therefore, the SiGen method, which is capable of splitting at a low temperature, may be preferable as a method for manufacturing a bonded wafer by the attachment of two substrates made of different materials.

In the meanwhile, in the method for manufacturing a bonded wafer comprising the lamination step as described above, the obtained wafer often has defects devoid of semiconductor layers, which are also referred to as voids, due to contaminant or gasses slipping into the attaching interface. These defects such as voids will cause problems in the manufacture of devices, and are thus desired to be reduced as much as possible. The voids are caused when the surfaces of the attaching layers fail to be closely bonded to each other due to contaminant, etc., so that the weakly attached or unattached portion of the semiconductor layer fails to be printed on the support layer in the splitting step. In order to prevent the occurrence of such voids, the cleanness of the substrate or the environment prior to the lamination is important. Therefore, the substrates are cleaned right before the attachment and the cleanness of the atmosphere for the attachment is kept at a high level.

However, the methods for manufacturing a bonded wafer tends to have voids, in particular, at the lamination terminal point even if the cleanness of the substrate prior to the attachment and the cleanness of the environment for the attachment are both kept at high levels. In addition, in order to prevent voids at the lamination terminal point, further high level cleanness is required, but enormous costs and efforts are required to that end.

Patent Document 1: Japanese Patent No. 3048201
Patent Document 2: Japanese Patent Application Laid-Open No. 11-145438
Patent Document 3: U.S. Pat. No. 6,263,941
Patent Document 4: U.S. Pat. No. 6,513,564
Patent Document 5: U.S. Pat. No. 6,582,999
Non-Patent Document 1: Auberton-Herve et al., "SMART CUT TECHNOLOGY: INDUSTRIAL STATUS of SOI WAFER PRODUCTION and NEW MATERIAL DEVELOPMENTS" (Electrochemical Society Proceedings Volume 99-3 (1999) p. 93-106)

DISCLOSURE OF THE INVENTION

Problem to be Solved by the Invention

The present invention has been made to solve these problems, and has an object to provide a method for manufacturing a bonded wafer with a good thin film over the entire substrate surface, in particular, even in the vicinity of the lamination terminal point.

Means for Solving the Problem

The present invention has been made to solve the problems, and provides a method for manufacturing a bonded wafer with a first substrate and a second substrate attached, the first substrate having a reduced film thickness on the second substrate, the method comprising at least the steps of: forming an ion-implanted region by implanting a hydrogen ion or a rare gas ion, or the both types of ions from a surface of the first substrate which is a semiconductor substrate; subjecting at least one of an ion-implanted surface of the first substrate and a surface of the second substrate to a surface activation treatment; laminating the ion-implanted surface of the first substrate and the surface of the second substrate to be attached in an atmosphere with a humidity of 30% or less and/or a moisture content of 6 g/m³ or less to make a laminate; and splitting the first substrate at the ion-implanted region so as to reduce thickness of the first substrate, thereby manufacturing a bonded wafer with a thin film on the second substrate.

Effects of the Invention

As described above, according to the method for manufacturing a bonded wafer of the present invention, the spreading speed of the closely attached area for attachment can be decreased by lowering the humidity of the atmosphere (reducing the moisture content in the atmosphere) for the attachment. Therefore, gases and minute contaminant present at the attaching interface can be effectively discharged. Then, adherent matter can be prevented from being gathered and then being trapped at the lamination terminal point, and a bonded wafer can be thus manufactured while preventing the occurrence of voids at the lamination terminal point.

As long as the method for manufacturing a bonded wafer includes such a step in which the first substrate and the second substrate are attached to each other in the atmosphere with a humidity of 30% or less and/or a moisture content of 6 g/m³ or less, the spreading speed of the closely attached area for the attachment can be decreased by lowering the humidity of the atmosphere (reducing the moisture content in the atmosphere) for the attachment. Therefore, gases and minute contaminant present at the attaching interface can be effectively discharged. Then, adherent matter can be prevented from being gathered and trapped in the lamination terminal point, and a bonded wafer can be thus manufactured while preventing the occurrence of voids at the lamination terminal point.

BRIEF EXPLANATION OF THE DRAWINGS

FIG. 4 is a flowchart showing an example of a method for manufacturing a bonded wafer, to which a method for manufacturing a bonded wafer of the present invention can be applied.

BEST MODE FOR CARRYING OUT THE INVENTION

The present invention will be described in more detail below.

As described above, according to the conventional methods for manufacturing a bonded wafer, the obtained bonded wafer tends to have voids especially at the lamination terminal point of the wafer even if the cleanness of the substrate prior to the attachment and the cleanness of the environment for the attachment were kept at high levels. In addition, in order to prevent voids at the lamination terminal point, further cleanness is required, which has problems such as enormous cost and effort required to that end.

The inventors have studied the cause of the occurrence of voids especially at the lamination terminal point as below.

Figure 2:
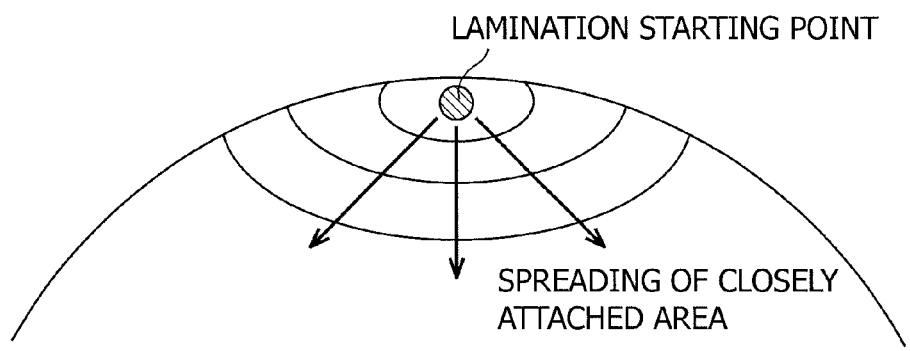
FIG. 2 is an illustration diagram schematically illustrating the spreading of a closely attached area from a lamination starting point.

The lamination is carried out in such a way that two substrates stacked one on top of the other are partially brought into close contact with each other. The lamination can be carried out in such a way that any one point on the substrates is defined as a lamination starting point and that the point is pressed to slide the substrates so as to keep out the air while rotating the substrates in a circular motion with the point as a center. Around the closely attached area, the substrates spontaneously adhere to each other because of the small gap between the substrates, and the closely attached area spreads from the lamination starting point toward the other. FIG. 2 schematically shows the spreading of the closely attached area around the lamination starting point. At the front of the spreading of the closely attached area, gases and minute contaminant present at the attaching interface are pushed out, and then swept out. Large contaminant fails to move during the lamination step, and remains there.

Even when the substrates are cleaned prior to attaching the substrates, gases and minute contaminant present in the atmosphere after the cleaning, in the atmosphere of a substrate storage unit, and in the atmosphere for the attachment are adherent in minute amounts to the substrate surfaces. When the substrate surfaces are activated prior to attaching the substrates, the substrate surfaces will tend to further adsorb the gases and minute contaminant. The minute amounts of adherent substances moves along the attaching interface and are gathered with the spreading of the closely attached area in the attaching step. This gathered adherent matter will result in countless numbers of voids at the lamination terminal.

In order to reduce the occurrence of voids at the lamination terminal point, the inventors have made further studies and experiments. As a result, the inventors have found that the occurrence of voids at the lamination terminal point can be reduced by reducing the moisture content (that is, lowering the humidity) in the atmosphere for the attachment.

This finding can be explained by the fact that the reduction in the moisture content of the atmosphere gas for the attachment decreases the spreading speed of the closely attached area, and effectively discharges gathered adherent matter from the attaching interface to the outside.

Figure 3:
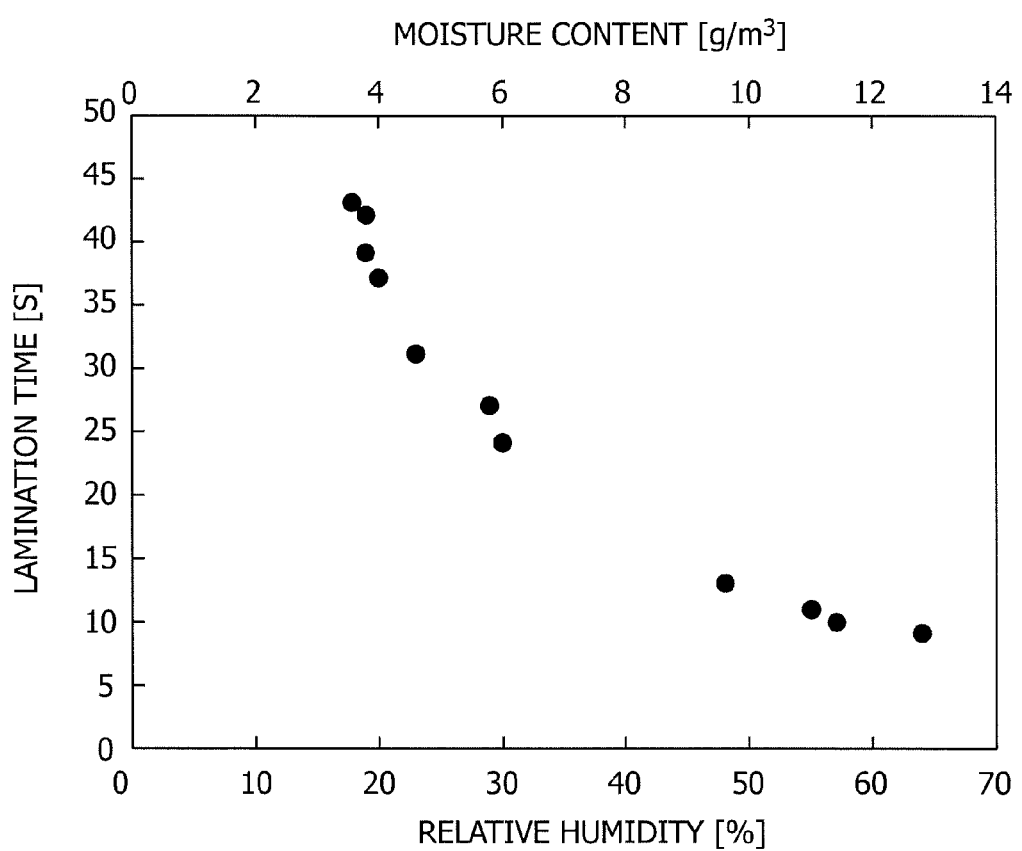
FIG. 3 is a graph showing the relationship between the attachment rate and the moisture content or relative humidity in an atmosphere.

The inventors made measurements for the relationship between the moisture content (humidity) in the atmosphere gas for the attachment and the time required for the attachment. The results of measurements at a temperature of 20° C. are shown in FIG. 3. The completion of the attachment was visually determined from the surface condition.

As is found from FIG. 3, when the moisture content in the atmosphere is higher (the humidity is higher), the lamination time is shorter, and more specifically, the attaching speed is higher, and the spreading of the closely attached area is faster.

Conventionally, for the purposes of reducing substances adhering to substrate surfaces, etc, the humidity is controlled to in the range of 45 to 65% in order to prevent static electricity. In addition, for example, in Japanese Patent Application Laid-Open No. 2007-141946, the humidity is adjusted to 46 to 60% in terms of 25° C. in an atmosphere for a cleaning system and a clean room.

The way of spreading the closely attached area in the vicinity of the lamination terminal point varies depending on the moisture content (humidity) in the atmosphere for the attachment.

Figure 1A:
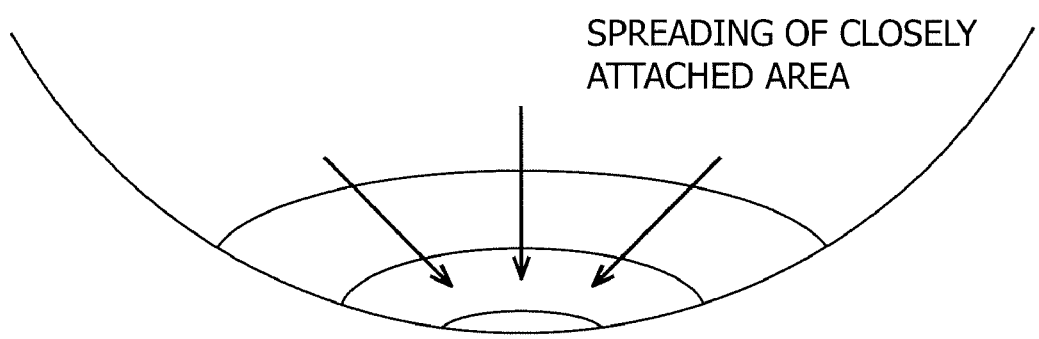
FIGS. 1(a) and 1(b) are illustration diagrams schematically illustrating the spreading of a closely attached area near the lamination terminal point in the case of lower humidity according to the present invention and in the case of the conventional higher humidity, respectively.
Figure 1B:
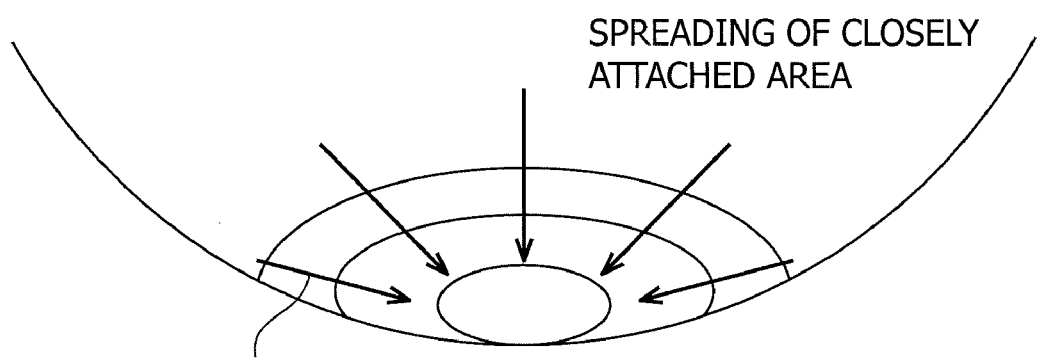

The way of spreading the closely attached area in the vicinity of the lamination terminal point is shown schematically in FIG. 1, where FIG. 1(a) shows a case in which the moisture content is lower, that is, the humidity is lower (a case according to the present invention), whereas FIG. 1(b) shows a case in which the moisture content is higher, that is, the humidity is higher (a conventional case). As shown in FIG. 1(b), higher humidity as in conventional cases results in the higher spreading speed of the closely attached area, the closely attached area may also spreads to the periphery, the closely attached area thus spreads from the periphery to the lamination terminal point, and the opening for sweeping adherent matter is narrowed to cause the adherent matter to be trapped inside. On the other hand, as shown in FIG. 1(a), the case of lower humidity results in the lower spreading speed of the closely attached area, without being affected by the spreading of the closely attached area from the periphery, then can secure the opening for sweeping adherent matter, which allows the effective removal of the gathered adherent matter.

The inventors have carried out further studies, and then found that the moisture content (humidity) may be controlled to 30% or less for the humidity and/or 6 g/m$^3$ or less for the moisture content in order to reduce voids at the lamination terminal point in a sufficiently effective manner, thereby arrived at the present invention.

While an embodiment of the present invention will be described in the following with reference to the drawings, the present invention is not to be construed as being limited to the following embodiments.

FIG. 4 shows a method for manufacturing a bonded wafer, to which the present invention can be applied.

First, a first substrate 10 of a semiconductor substrate and a second substrate 20 are prepared as shown in FIG. 4(a) (step a).

In this case, the first substrate 10 can be a single-crystal silicon substrate, or a single-crystal silicon substrate with an oxide film formed on its surface. When these materials are selected as the first substrate, a bonded wafer with a silicon thin film can be manufactured. The use of a single-crystal silicon substrate with an oxide film formed on its surface is convenient for manufacturing a SOI wafer. In addition, in order to manufacture a bonded wafer with a thin film of a compound semiconductor such as GaN other than a silicon thin film, the first substrate 10 can be a compound semiconductor substrate such as GaN.

According to the present invention, a high-quality bonded wafer with a good silicon thin film such as a SOI wafer, which is particularly required in recent years, can be manufactured in high yield rate while suppressing the incidence of defective products with voids therein.

Additionally, according to the present invention, in addition to the silicon thin film, a bonded wafer with a favorable thin film composed of a compound semiconductor such as GaN can be also manufactured in high yield rate while suppressing the incidence of defective products with voids therein.

In addition, the second substrate 20 can be any insulating substrate of a quartz substrate, a sapphire (alumina) substrate, a SiC substrate, a borosilicate glass substrate, a crystallized glass substrate, and an aluminum nitride substrate, or can be any of a single-crystal silicon substrate, a single-crystal silicon substrate with an oxide film formed on its surface and a SiGe substrate. The second substrate 20 may be appropriately selected from these substrates, depending on the intended use of a semiconductor device to be manufactured. Of course, materials other than these substrates may be used.

Next, as shown in FIG. 4(b), hydrogen ions are implanted from a surface (an ion-implanted surface) 12 of the first substrate 10 to form an ion-implanted region 11 (step b).

For the formation of the ion-implanted region 11, the ion implantation of rare gas ions or of both hydrogen ions and rare gas ions may be carried out, in addition to the implantation of hydrogen ions. The other ion implantation conditions such as the implantation energy, the implantation dose, and the implantation temperature may also be appropriately selected so that a thin film with a predetermined thickness can be obtained. While specific examples of the ion implantation conditions include the substrate temperature of 250° C. to 400° C. for implantation, the ion implantation depth of 0.5 μm, the implantation energy of 20 to 100 keV, and the implantation dose of $1\times10^{16}$ to $1\times10^{17}$/cm$^2$, the ion implantation conditions are not limited to these examples.

Further, when a single-crystal silicon substrate with an oxide film formed on its surface is used to carry out ion implantation through the oxide film, the inhibitory effects on channeling of implanted ions is achieved, and the variation in ion implantation depth can be thus further reduced. This reduction of the variation in ion implantation depth enables to form a thin film with high uniformity in film thickness.

Next, as shown in FIG. 4(c), both the ion-implanted surface 12 of the first substrate 10 and a surface 22 of the second substrate 20 to be attached are subjected to a surface activation treatment (step c). It should be noted that the surface 22 of the second substrate 20 to be attached refers to a surface to be attached to the first substrate in the next step d of a lamination step.

Of course, only either one surface of the ion-implanted surface 12 of the first substrate 10 and the surface 22 of the second substrate 20 to be attached may be subjected to a surface activation treatment.

In this case, the surface activation treatment can be a plasma treatment. When the surface activation treatment is a plasma treatment as mentioned above, the surface of the substrate subjected to the surface activation treatment is activated by an increase in the number of OH groups. Accordingly, in this condition, when the ion-implanted surface 12 of the first substrate and the surface 22 of the second substrate 20 to be attached are brought into close contact with each other, the substrate can be attached more tightly by hydrogen bonding, etc. In addition, the surface activation treatment can be carried out by ozone treatment or the like, and multiple types of treatments may be combined.

In addition, in the method for manufacturing a bonded wafer according to the present invention, even when the plasma treatment is the surface activation treatment as described above, voids can be prevented at the lamination terminal point.

In the case of a treatment with plasma, a substrate, which is cleaned by RCA cleaning or the like, is placed in a vacuum chamber charged by a plasma gas, and then exposed to high-frequency plasma in the order of 100 W for approximately 5 to 30 seconds to subject the surface of the substrate to a plasma treatment. As a gas for plasma, for example, plasma from oxygen gas can be used in the case of a treatment for a single-crystal silicon substrate with an oxide film formed on its surface, whereas hydrogen gas, argon gas, or a mixed gas thereof, or a mixture of hydrogen gas and helium gas can be used in the case of a treatment for a single-crystal silicon substrate with no oxide film formed on its surface. Alternatively, nitrogen gas as an inert gas may be used.

In the case of a treatment with ozone, a substrate, which is cleaned by RCA cleaning or the like, is placed in a chamber with the air introduced therein. Then a gas for plasma such as nitrogen gas or argon gas is introduced into the chamber, and high-frequency plasma is generated to convert oxygen in the air to ozone, and thereby subject the surface of the substrate to an ozone treatment.

Next, as shown in FIG. 4(d), the ion-implanted surface 12 of the first substrate and the surface 22 of the second substrate 20 to be attached are brought into close contact with each other and attached to each other (step d).

When the substrates are brought into close contact with each other, for example, at room temperature under reduced pressure or under ordinary pressure, with the use of the surface subjected to the surface activation treatment as a surface to be attached as described above, the both substrates can be attached tightly enough to withstand subsequent mechanical split, without applying any high temperature treatment.

Furthermore, in the present invention, the atmosphere for carrying out this attaching step has a humidity of 30% or less and/or a moisture content of 6 g/m$^3$ or less. It should be noted that the term "humidity" used herein refers to a relative humidity, that is, the ratio of the moisture content to the moisture content at saturation at the temperature.

While the lamination temperature is not particularly limited to, the range of the humidity and/or the range of the moisture content are preferably satisfied at each lamination temperature.

In addition, since the humidity is low as described above, static electricity tends to be generated on the substrate surface, and tends to adsorb contaminant. Thus, it is desirable to suppress the generation of static electricity with the use of an ionizer or the like.

Further, after the step of laminating the first substrate and the second substrate, a heat treatment step can be carried out for subjecting the laminate to a heat treatment at 100 to 400° C.

When the laminate is subjected to a heat treatment at 100 to 400° C. after laminating the first substrate and the second substrate, the bonding strength between the first substrate and the second substrate can be increased. In particular, when the heat treatment temperature is 100 to 300° C., thermal strain, cracks, delamination, etc. due to the difference in thermal expansion coefficient can be further reduced even when attaching substrates made of different materials. The increased bonding strength can reduce the occurrence of defects in the splitting step.

On the other hand, when the same type of materials are to be attached as in the case of the use of silicon substrates for both the first substrate and the second substrate, the heat treatment can be carried out at a temperature up to 400° C., the bonding strength can be thus further increased.

Next, as shown in FIG. 4(e), the first substrate 10 may split at the ion-implanted region 11 so that the film thickness of the first substrate 10 can be reduced (step e).

This split (reduction in film thickness) of the first substrate can be carried out by, for example, mechanically applying an external force. In particular, it is preferable that the split be carried out by imparting an external impact from one end of the first substrate and by a cleavage propagating from one end with the external impact imparted toward the other end, because the unidirectionally propagating cleavage can be relatively easily controlled to obtain a thin film with high uniformity in film thickness. It should be noted that in this case, the one end with the external impact imparted has no particular relevance to the lamination starting point in the laminating step d, and their positions can be determined depending on the condition of the manufacturing process, etc.

Then, through the steps (FIGS. 4(a) to 4(e)) described above, a bonded wafer 30 is manufactured which has a thin film 31 on the second substrate 20 as shown in FIG. 4(f).

The present invention provides the humidity of 30% or less and/or the moisture content of 6 g/m$^3$ or less in the attaching step of step d as described above, thus allowing the spreading speed of the closely attached area to be decreased, allowing adherent matter to be effectively removed at the lamination terminal point, and allowing the adherent matter to be prevented from being trapped. Therefore, the subsequent split step (step e), etc. can be carried out to manufacture a bonded wafer while preventing voids from being caused at the lamination terminal point. Further, in the present invention, the inhibitory effects on the occurrence of voids at the lamination terminal point is higher when the humidity is as low as possible (the moisture content is as low as possible), and in such a case, it is desirable to further strengthen the countermeasure against static electricity by use of an ionizer or the like.

EXAMPLES

The present invention will be described below more specifically with reference to examples of the present invention and a comparative example. However, the present invention is not to be construed as being limited to these examples.

Example 1

A bonded wafer was manufactured as follows in accordance with the method for manufacturing a bonded wafer according to the attaching method as shown in FIG. 4.

First, a mirror-polished single-crystal silicon substrate having a diameter of 150 mm was prepared as a first substrate 10. Then, a silicon oxide film layer with a thickness of 100 nm was formed by thermal oxidation on the surface of the first substrate. In addition, a synthetic quartz substrate having a diameter of 150 mm was prepared as a second substrate 20 (step a).

Next, hydrogen ions were implanted through the formed silicon oxide film layer into the first substrate 10 to form a microbubble layer (ion-implanted region) 11 parallel to the surface at the average travel depth of the ions (step b). The ion implantation conditions were set to the implantation energy of 35 keV, an implantation dose of $9 \times 10^{16}/cm^2$, and an implantation depth of 0.3 µm.

Next, the ion-implanted first substrate 10 was placed in a plasma treatment system, nitrogen was introduced as a gas for plasma, and the ion-implanted surface was then subjected to a high-frequency plasma treatment for 10 seconds by applying a high frequency wave of 13.56 MHz between parallel plate electrodes of 300 mm in diameter at the condition of high frequency power of 50 W under a reduced pressure condition of 2 Torr (270 Pa). In this way, the ion-implanted surface 12 of the first substrate 10 was subjected to a surface activation treatment.

On the other hand, the second substrate 20 was placed in a plasma treatment system, nitrogen gas was introduced as a gas for plasma between close electrodes, and a high frequency wave was then applied between the electrodes to generate plasma, and carry out a high-frequency plasma treatment for 10 seconds. In this way, the surface 22 of the second substrate 20 to be attached in the next attaching step was also subjected to a surface activation treatment (step c).

The first substrate 10 and the second substrate 20 subjected to the surface activation treatments as described above were pressed to be brought into close contact with each other at room temperature, with the surfaces subjected to the surface activation treatments as surfaces to be attached and with a point of the substrate as a lamination starting point, and the rear surfaces of the both substrates were then strongly pressed in the thickness direction (step d).

It should be noted that the atmosphere for the attachment was controlled to a temperature of 20° C. and a moisture content of 6 g/m$^3$ by placing a dehumidifier. More specifically, the relative humidity was 33%.

Further, the spreading of the closely attached area in this case was observed from the second substrate (transparent synthetic quartz substrate) side. In the vicinity of the lamination terminal point, the spreading was observed as shown in FIG. 1(a).

Next, in order to increase the bonding strength, the laminate of the first substrate 10 and second substrate 20 was subjected to a heat treatment at 300° C. for 6 hours.

Next, in order to form the origin of a cleavage, an edge of scissors was used to impart an external impact from one end of the first substrate to the ion-implanted region 11 of the first substrate. After that, the first substrate 10 and the second substrate were relatively kept away from each other to gradually separate the first substrate 10 and the second substrate 20 at the ion-implanted region 11 from the one end toward the other end (step e).

In this way, a bonded wafer 30 with a thin film 31 on the second substrate 20 was manufactured. When this bonded wafer 30 was observed from second substrate (transparent synthetic quartz substrate) side, the substrate surface had almost no voids found therein, and the lamination terminal point had approximately two voids observed.

Example 2

A bonded wafer was manufactured in the same way as in Example 1, provided that the atmosphere for attachment in the attaching step (step d) was adapted to have a temperature of 20° C. and a moisture content of 5 g/m$^3$, that is, a relative humidity of 27%.

When the thus manufactured bonded wafer was observed for the occurrence of voids in the same way as in the case of Example 1, the substrate surface had almost no voids found therein, and the lamination terminal point had no voids found.

Example 3

A bonded wafer was manufactured in the same way as in Example 1, provided that the atmosphere for attachment in the attaching step (step d) was adapted to have a temperature of 25° C. and a moisture content of 6 g/m$^3$, that is, a relative humidity of 24%.

When the thus manufactured bonded wafer was observed for the occurrence of voids in the same way as in the case of Example 1, the substrate surface had almost no voids found therein, and the lamination terminal point had no voids found.

Comparative Example

A bonded wafer was manufactured in the same way as in Example 1, provided that the atmosphere for attachment in the attaching step (step d) was adapted to have a temperature of 20° C. and a moisture content of 10 g/m$^3$, that is, a relative humidity of 55%.

When the spreading of the closely attached area was observed in the same way as in the case of Example 1, the spreading was found as shown in FIG. 1 (b) in the vicinity of the lamination terminal point.

When the thus manufactured bonded wafer was observed for the occurrence of voids in the same way as in the case of Example 1, the lamination terminal point had a lot of voids found.

The results describe above reveal as the advantageous effect of the present invention that the occurrence of voids can be prevented at the lamination terminal point when the atmosphere for attachment is adapted to have a humidity of 30% or less and/or a moisture content of 6 g/m$^3$ or less.

It should be noted that the present invention is not to be considered limited to the embodiment described above. The embodiment is given as an example, and the technical scope of the present invention encompasses any embodiments as long as the embodiments involve substantially the same construction as and produce similar operation and effect to the technical idea as recited in the claims of the present invention.

Explanation Of References

10: first substrate; 11: ion-implanted region; 12: ion-implanted surface;
20: second substrate; 22: surface to be attached
30: bonded wafer; 31: thin film.

The invention claimed is:

1. A method for manufacturing a bonded wafer with a first substrate and a second substrate attached, the first substrate having a reduced film thickness on the second substrate, the method comprising at least the steps of:
    forming an ion-implanted region by implanting a hydrogen ion or a rare gas ion, or the both types of ions from a surface of the first substrate which is a semiconductor substrate;
    subjecting at least one of an ion-implanted surface of the first substrate and a surface of the second substrate to a surface activation treatment;
    laminating the ion-implanted surface of the first substrate and the surface of the second substrate in an atmosphere with a humidity of 30% or less or a moisture content of 6 g/m3 or less to make a laminate, wherein the laminating is carried out in such a way that any one point on the substrates is defined as a lamination starting point and that the point is pressed to slide the substrates so as to keep out air while rotating the substrates in a circular motion with the point as a center of rotation; and
    splitting the first substrate at the ion-implanted region so as to reduce thickness of the first substrate, thereby manufacturing a bonded wafer with a film on the second substrate.

2. The method for manufacturing a bonded wafer according to claim 1, wherein the first substrate is any one of a single-crystal silicon substrate, a single-crystal silicon substrate with an oxide film formed on its surface and a compound semiconductor substrate.

3. The method for manufacturing a bonded wafer according to claim 1, wherein the second substrate is any one of a quartz substrate, a sapphire (alumina) substrate, a SiC substrate, a borosilicate glass substrate, a crystallized glass substrate, an aluminum nitride substrate, a single-crystal silicon substrate, a single-crystal silicon substrate with an oxide film formed on its surface and a SiGe substrate.

4. The method for manufacturing a bonded wafer according to claim 1, further comprising a step of subjecting the laminate to a heat treatment at 100° C. to 400° C. between the laminating step and the splitting step.

5. The method for manufacturing a bonded wafer according to claim 1, wherein the surface activation treatment is a plasma treatment.

6. The method for manufacturing a bonded wafer according to claim 1, wherein the split of the first substrate at the ion-implanted region in the splitting step is carried out by imparting an external impact from one circumferential surface of the first substrate and by a cleavage propagating from the circumferential surface toward the opposite circumferential surface.

* * * * *